United States Patent
Wen et al.

(10) Patent No.: US 9,443,809 B2
(45) Date of Patent: Sep. 13, 2016

(54) PORTABLE APPARATUS, IC PACKAGING STRUCTURE, IC PACKAGING OBJECT, AND IC PACKAGING METHOD THEREOF

(71) Applicant: uPI semiconductor corp., Zhubei, Hsinchu County (TW)

(72) Inventors: Chau-Chun Wen, Zhubei (TW); Hsing-Wu Li, Zhubei (TW)

(73) Assignee: UPI SEMICONDUCTOR CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 14/732,086

(22) Filed: Jun. 5, 2015

(65) Prior Publication Data

US 2016/0027742 A1 Jan. 28, 2016

(30) Foreign Application Priority Data

Jul. 25, 2014 (TW) .............................. 103125569 A

(51) Int. Cl.
*H01L 23/31* (2006.01)
*H01L 21/56* (2006.01)
*H01L 23/00* (2006.01)
*H01L 23/492* (2006.01)
*H01L 23/58* (2006.01)
*H01L 21/60* (2006.01)

(52) U.S. Cl.
CPC ............ *H01L 23/562* (2013.01); *H01L 21/56* (2013.01); *H01L 23/3171* (2013.01); *H01L 23/492* (2013.01); *H01L 23/585* (2013.01); *H01L 24/08* (2013.01); *H01L 24/32* (2013.01); *H01L 2021/6027* (2013.01); *H01L 2224/08113* (2013.01); *H01L 2224/32104* (2013.01); *H01L 2224/32221* (2013.01)

(58) Field of Classification Search
CPC .................................................. H01L 23/4855
See application file for complete search history.

(56) References Cited

U.S. PATENT DOCUMENTS

| 5,648,661 A | 7/1997 | Rostoker et al. |
|---|---|---|
| 6,692,629 B1 | 2/2004 | Chen et al. |
| 2011/0037163 A1* | 2/2011 | Lachner ............... H01L 21/561 257/693 |
| 2013/0168830 A1 | 7/2013 | Uehling |

* cited by examiner

*Primary Examiner* — Stephen W Smoot
(74) *Attorney, Agent, or Firm* — McClure, Qualey & Rodack, LLP

(57) ABSTRACT

A portable apparatus, an IC packaging structure, an IC packaging object, and an IC packaging method thereof are disclosed. The IC packaging structure includes an IC packaging object and a substrate. The packaging object includes a die and a metallurgy layer. The die has a contact portion, a saw reserved portion, and a seal ring. The seal ring is disposed between the contact portion and the saw reserved portion. The metallurgy layer is disposed on the contact portion. At least a part of the metallurgy layer overlaps the seal ring. The metallurgy layer includes a solderable layer coated by a solder paste. The substrate includes a solder pad. The solder pad is coupled to the solderable layer coated by the solder paste.

14 Claims, 7 Drawing Sheets

PORTABLE APPARATUS, IC PACKAGING STRUCTURE, IC PACKAGING OBJECT, AND IC PACKAGING METHOD THEREOF

BACKGROUND OF THE INVENTION

1. Field of the Invention

The invention relates to integrated circuit (IC) package; in particular, to a portable apparatus, an IC packaging structure, an IC packaging object, and an IC packaging method thereof.

2. Description of the Prior Art

In recent years, with the innovation and development of technology, various kinds of portable apparatus, such as smart phone, notebook, tablet PC, and wearable electronic apparatus (e.g., smart watch or smart glass), have been widely used in consumer's daily life.

However, consumers have more and more requirements for portable apparatus. For example, the consumers want that the portable apparatus not only provides more functions but also has smaller size. Therefore, if conventional packaging method is still used to package the IC chip having ultra-small size in the portable apparatus, it is hard to reduce the volume of the IC packaging object, and when the IC chip is carried by the carrier board and/or printed circuit board, the phenomenon of solder empty easily occurs and results in poor product assembly yield.

SUMMARY OF THE INVENTION

Therefore, the invention provides a portable apparatus, an IC packaging structure, an IC packaging object, and an IC packaging method thereof to solve the above-mentioned problems occurred in the prior arts.

An embodiment of the invention is an IC packaging object. In this embodiment, the IC packaging object includes a die and a metallurgy layer. The die has a contact portion, a saw reserved portion, and a seal ring. The seal ring is disposed between the contact portion and the saw reserved portion. The metallurgy layer is disposed on the contact portion and at least a part of the metallurgy layer overlaps the seal ring.

In an embodiment, the saw reserved portion has a default width and at least a part of the metallurgy layer is disposed on the saw reserved portion.

In an embodiment, the default width is 10 µm.

In an embodiment, a distance between an outer edge of the metallurgy layer and an outer edge of the saw reserved portion is 0~54 µm.

In an embodiment, the metallurgy layer includes a solderable layer, and a solder paste is coated on the solderable layer to couple to a solder pad on a carrier board.

Another embodiment of the invention is an IC packaging structure. In this embodiment, the IC packaging structure includes an IC packaging object and a carrier board. The IC packaging object includes a die and a metallurgy layer. The die has a contact portion, a saw reserved portion, and a seal ring. The seal ring is disposed between the contact portion and the saw reserved portion. The metallurgy layer is disposed on the contact portion and at least a part of the metallurgy layer overlaps the seal ring. The metallurgy layer includes a solderable layer coated by a solder paste. The carrier board includes a solder pad. The solder pad is coupled to the solderable layer coated by the solder paste.

In an embodiment, the saw reserved portion has a default width and at least a part of the metallurgy layer is disposed on the saw reserved portion.

In an embodiment, the default width is 10 µm.

In an embodiment, a distance between an outer edge of the metallurgy layer and an outer edge of the saw reserved portion is 0~54 µm.

In an embodiment, an area of the solder pad is larger than an area of the solderable layer coated by the solder paste.

Another embodiment of the invention is a portable apparatus. In this embodiment, the portable apparatus includes a circuit board and an IC packaging object. The IC packaging object includes a die and a metallurgy layer. The die has a contact portion, a saw reserved portion, and a seal ring. The seal ring is disposed between the contact portion and the saw reserved portion. The metallurgy layer is disposed on the contact portion and at least a part of the metallurgy layer overlaps the seal ring. The metallurgy layer includes a solderable layer coated by a solder paste. The IC packaging object is coupled to the circuit board through the solderable layer coated by the solder paste.

In an embodiment, the saw reserved portion has a default width and at least a part of the metallurgy layer is disposed on the saw reserved portion.

In an embodiment, the default width is 10 µm.

In an embodiment, a distance between an outer edge of the metallurgy layer and an outer edge of the saw reserved portion is 0~54 µm.

Another embodiment of the invention is an IC packaging method. In this embodiment, the IC packaging method includes steps of: (a) providing a die, wherein the die has a contact portion, a saw reserved portion, and a seal ring, the seal ring is disposed between the contact portion and the saw reserved portion; and (b) disposing a metallurgy layer on the contact portion, wherein at least a part of the metallurgy layer overlaps the seal ring.

In an embodiment, the saw reserved portion has a default width and at least a part of the metallurgy layer is disposed on the saw reserved portion.

In an embodiment, the default width is 10 µm.

In an embodiment, a distance between an outer edge of the metallurgy layer and an outer edge of the saw reserved portion is 0~54 µm.

Compared to the prior arts, at least a part of the metallurgy layer of the IC die in the invention overlaps the seal ring and/or the saw reserved portion, so that the distance between the outer edge of the metallurgy layer and the outer edge of the saw reserved portion will be smaller than the minimum distance achieved by existing processes. Therefore, the ultra-small size IC packaging structure can be achieved and it can be widely applied in any portable apparatus having small size and volume (e.g., wearable electronic apparatus like smart watch or smart glass) with considerable market potential.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
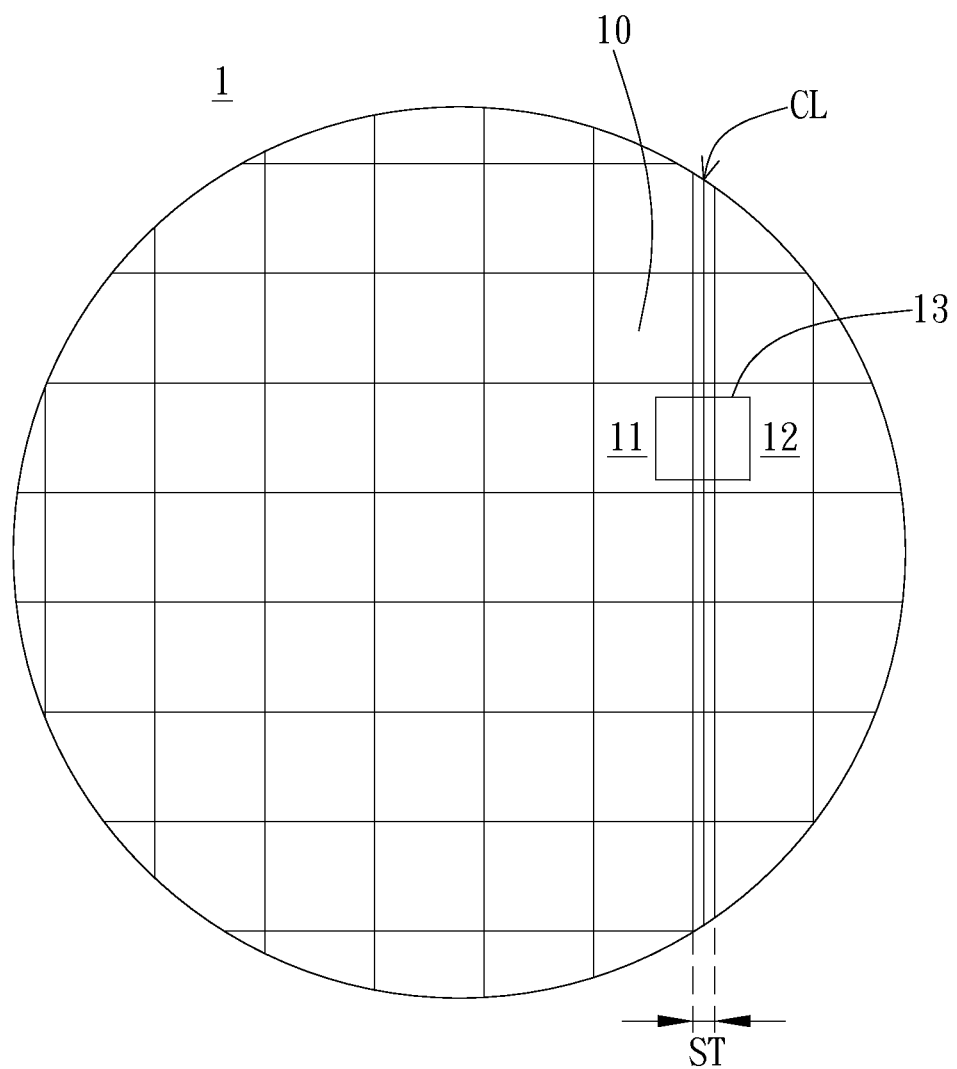
FIG. 1 illustrates a schematic diagram of a finished wafer including a plurality of dies.

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts. In the following embodiments, if an element is "connected" or "coupled" to another element, the element may be directly connected or coupled to the another element, or there may be any elements or specific materials (e.g., colloid or solder) disposed between the element and the another element.

A preferred embodiment of the invention is an IC packaging structure. In this embodiment, the IC packaging structure includes an IC packaging object and a carrier board. The IC packaging object includes a die cut from a finished wafer, and the die include IC. The carrier board is used to carry a packaging object packaging the die, but not limited to this. In an embodiment of the invention, the IC in the die can be a power metal-oxide-semiconductor field-effect transistor (MOSFET), a low dropout regulator (LDO), or any other ICs having few pins, but not limited to this.

It should be noticed that the carrier board is usually called an IC substrate or an IC carrier board. Its main function is used as a carrier to carry the die and use its inner wires to connect signals between the die and a PCB. The carrier board is a key element in packaging process and it can achieve effects of circuit protection, wire fixing, and heat dissipation. In practical applications, the material of the carrier board has not specific limitations. For example, the carrier board can be a printed circuit board, a ceramics carrier board, a plastic carrier board, a metal carrier board, or a tape carrier board, but not limited to this.

Please refer to FIG. 1. FIG. 1 illustrates a schematic diagram of the finished wafer including a plurality of dies. As shown in FIG. 1, the finished wafer 1 includes a plurality of dies 10. Usually, there are ICs having different types or functions disposed on these dies 10, but not limited to this. In fact, appropriate die cutter can be used to cut the finished wafer 1 along a cutting line CL to form these dies 10. It should be noticed that the blade of the die cutter usually has a certain thickness (or width), for example, 15~20 μm; therefore, there is a cutting path ST designed on the die 10 and the cutting path ST has a default cutting path width, for example, 50 μm, to avoid the damages of the inner circuit in the die 10 caused by the blade cutting deviation.

Figure 2A:
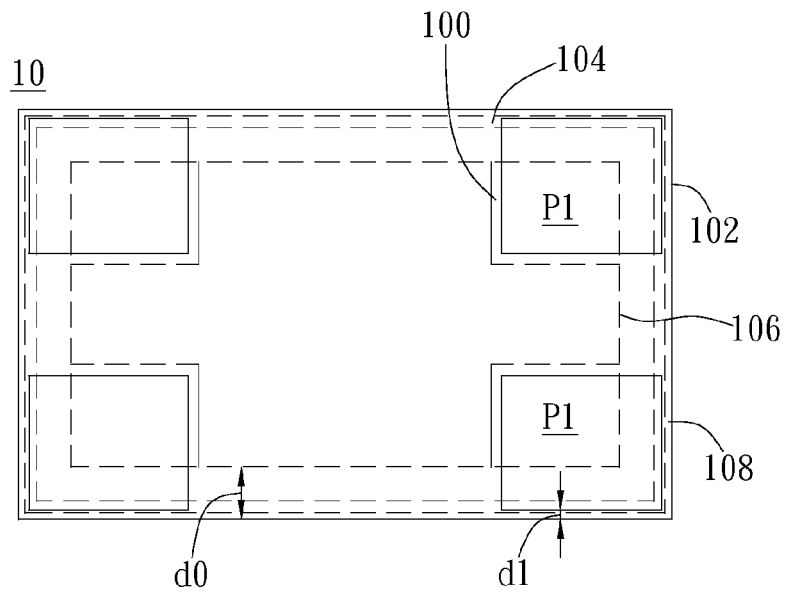
FIG. 2A and FIG. 2B illustrate top view and side view of the die cut from the finished wafer in an embodiment of the invention respectively.
Figure 2B:
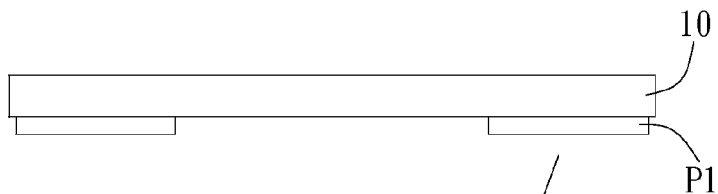

Then, please refer to FIG. 2A and FIG. 2B. FIG. 2A and FIG. 2B illustrate top view and side view of the die 10 cut from the finished wafer 1 in FIG. 1 respectively. As shown in FIG. 2A and FIG. 2B, the die 10 includes a contact portion 100, a die boundary 102, a seal ring 104, an effective circuit boundary 106, a saw reserved portion 108, and a metallurgy layer P1.

The contact portion 100 is located in an effective circuit region surrounded by the effective circuit boundary 106. After the die cutter cuts the finished wafer 1 along the cutting path ST to form the dies 10, the remaining cutting path on the die 10 is called the saw reserved portion 108. In practical applications, the saw reserved portion 108 can have a default width of 10 μm, but not limited to this. The saw reserved portion 108 is located between the die boundary 102 and the seal ring 104. The seal ring 104 is located between the contact portion 100 and the saw reserved portion 108. In an embodiment of the invention, the width of the seal ring 104 can be 25 μm. In another embodiment of the invention, the metallurgy layer P1 is disposed on the contact portion 100 and at least a part of the metallurgy layer P1 overlaps the seal ring 104.

It should be noticed that the contact portion (bump) 100 on the die 10 is usually the communication media between pins of the chip packaging object and IC circuits in the die 10. In addition, the size of the die 10 in this embodiment should be also small enough, so that the die 10 can be used in a potable apparatus having small size and volume. In this embodiment, the number of the contact portion 100 disposed on the die 10 is 16 at most and 3~8 is preferred, but not limited to this.

In this embodiment, as shown in FIG. 2A, it is assumed that a distance between an outer edge of the contact portion 100 and the die boundary 102 is d0; a distance between an outer edge of the metallurgy layer P1 and an outer edge of the saw reserved portion 108 (namely the die boundary 102) is d1. In the prior arts, an outer edge of the conventional metallurgy layer at most overlaps an outer edge of the contact portion; that is to say, the distance d0 between the outer edge of the conventional metallurgy layer and the die boundary is at least 55 μm. Different from the prior arts, the outer edge of the metallurgy layer P1 in this embodiment is extended to overlap the seal ring 104. Therefore, in this embodiment, the distance d1 between the outer edge of the metallurgy layer P1 and the outer edge of the saw reserved portion 108 is smaller than 55 μm. It usually ranges from 0 to 55 μm. In an embodiment of the invention, d1 ranges from 0 to 54 μm; in another embodiment, it is preferred that d1 ranges from 10 to 54 μm, but not limited to this.

Figure 2C:
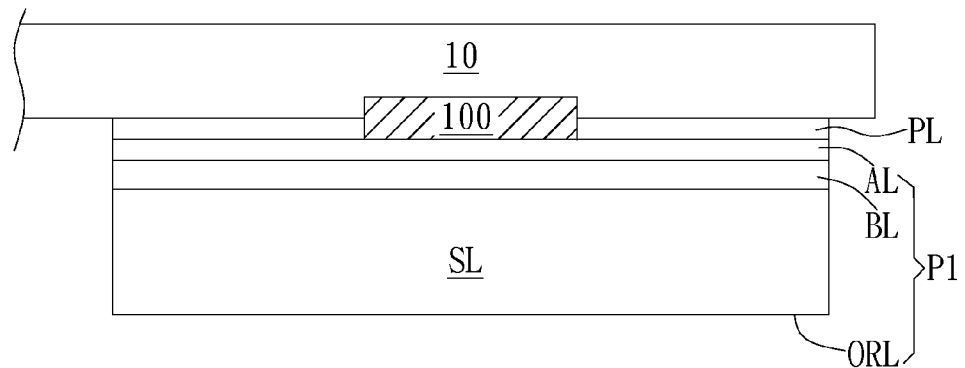
FIG. 2C illustrates an enlarged diagram of the metallurgy layer in FIG. 2B.

In addition, as shown in FIG. 2C, a passivation layer PL is disposed around the contact portion 100 of the die 10 and used to isolate the contact portion 100 and prevent the contact portion 100 from being electrically connected to outside. The metallurgy layer P1 is disposed on the contact portion 100 of the die 10 and the passivation layer PL. In this embodiment, the metallurgy layer P1 can be an under bump metallurgy (UBM) layer, and the UBM layer can be also called multi-layer metal layer. In this embodiment, the metallurgy layer P1 used as the UBM layer can include an adhesion layer AL, a barrier layer BL, a solderable layer SL, and an oxidation resistance layer ORL. In another embodiment, the metallurgy layer P1 can also include at least one metal layer or at least one solderable layer, but not limited to this.

The adhesion layer AL is formed on the contact portion 100 of the die 10 and the passivation layer PL to form stronger link with the contact portion 100 and the passivation layer PL; the barrier layer BL is formed on the adhesion layer AL to avoid the diffusion between the contact portion 100 and the solderable layer SL. In fact, the material of the adhesion layer AL and the barrier layer BL can be chromium (Cr), titanium (Ti), titanium/tungsten (Ti/W), nickel (Ni), palladium (Pd), or molybdenum (Mo), and its thickness can be about 0.15~0.2 mm, but not limited to this.

The solderable layer SL is formed on the barrier layer BL. When the reflow process is performed, the solder can be completely stranded on the solderable layer SL and become a ball shape. In fact, the material of the solderable layer SL can be copper (Cu), nickel (Ni), or palladium (Pd), and its thickness can be about 1~5 mm, but not limited to this. In this embodiment, a solder paste can be coated on the solderable layer SL, so that the die 10 can be electrically connected with the carrier board or the circuit board. In an embodiment of the invention, the thickness of the solderable layer SL is larger than the thickness of the barrier layer BL, but not limited to this.

The oxidation resistance layer ORL is formed on the solderable layer SL to protect the adhesion layer AL, the barrier layer BL, and the solderable layer SL from being oxidized. In fact, the material of the oxidation resistance layer ORL can be usually Gold (Au), and its thickness can be about 0.05~0.1 mm, but not limited to this.

Figure 3A:
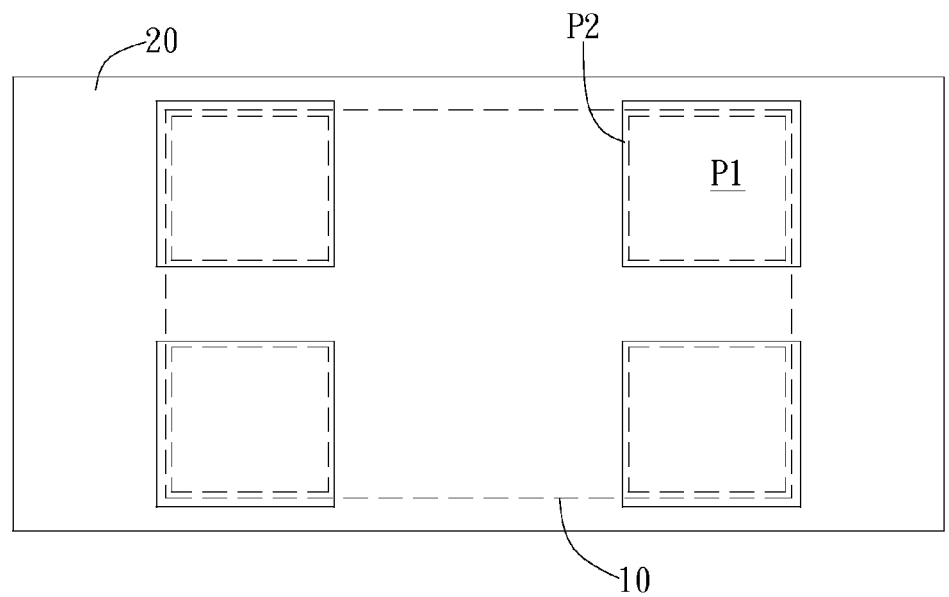
FIG. 3A and FIG. 3B illustrate a top view and a side view of the carrier board respectively.
Figure 3B:
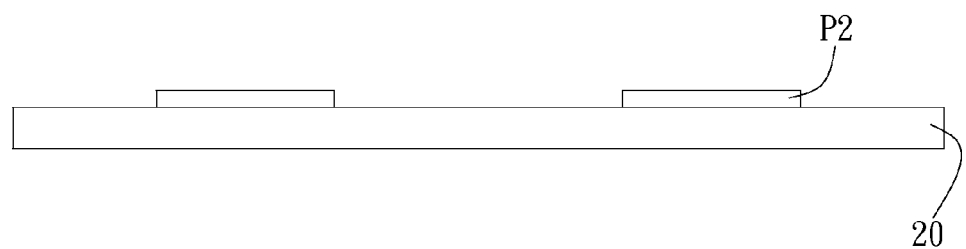

Please refer to FIG. 3A and FIG. 3B. FIG. 3A and FIG. 3B illustrate top view and side view of the carrier board respectively. As shown in FIG. 3A and FIG. 3B, a solder pad P2 is disposed on the carrier board 20. In order to compare the solder pad P2 on the carrier board 20 with the metallurgy layer P1 on the die 10, FIG. 3A shows the die 10 and its metallurgy layer P1 in dotted lines. It should be noticed that the die 10 is carried by the carrier board 20, so that the solder pad P2 disposed on the carrier board 20 corresponds to the metallurgy layer P1 on the die 10. Since the area of the solder pad P2 disposed on the carrier board 20 is slightly larger than the area of the metallurgy layer P1 on the die 10, the solderable layer SL coated by the solder paste on the die 10 of FIG. 2C and the solder pad P2 on the carrier board 20 of FIG. 3B can be coupled to each other in the reflow way, as shown in the slash portion of FIG. 4B, to form the electrical connection between the solderable layer SL and the solder pad P2 without the solder empty phenomenon.

Figure 4A:
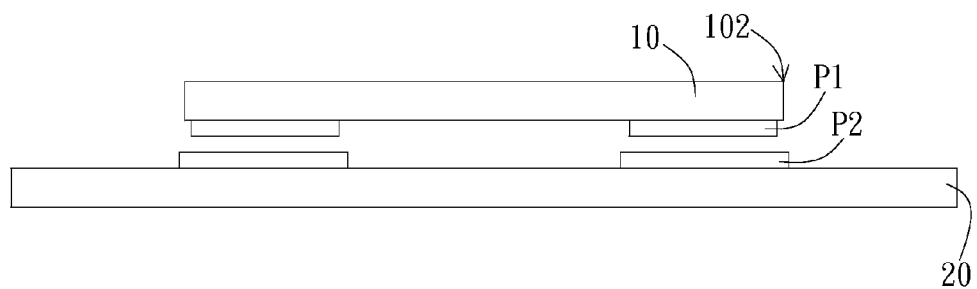
FIG. 4A and FIG. 4B illustrate schematic diagrams of forming the electrical connection between the solder pad on the die and the solder pad on the carrier board through a reflow method.
Figure 4B:
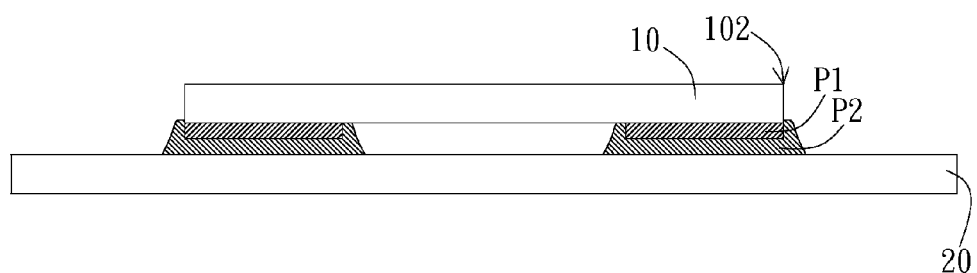

By doing so, the die 10 can be carried on the carrier board 20, and the die 10 and the carrier board 20 are electrically connected to each other. As shown in FIG. 3A and FIG. 4A, because the solder pad P2 on the carrier board 20 has larger area than the metallurgy layer P1, a part of the solder pad P2 is located outside the die boundary (dotted line) 102 of the die 10. In addition, the metallurgy layer P1 on the die 10 is very close to the die boundary 102. Therefore, when the metallurgy layer P1 on the die 10 and the solder pad P2 on the carrier board 20 are coupled to each other in the reflow way, as shown in FIG. 4B, some melt solder pad P2 on the carrier board 20 will be partially coupled with a side of the die 10.

Then, the carrier board 20 carrying the die 10 can be disposed on a PCB (or a mother board) in a portable apparatus and electrically connected with the PCB, so that the carrier board 20 can connect the signals between the die 10 and the PCB through its inner wires. By doing so, the portable apparatus can control the IC in the effective circuit area of the die 10 to perform a specific function through the PCB and the carrier board 20. In another embodiment, the die 10 can be also coupled with the solder pad on the PCB in the portable apparatus through the metallurgy layer P1 and the solder paste coated on the solderable layer SL of the metallurgy layer P1.

Figure 5A:
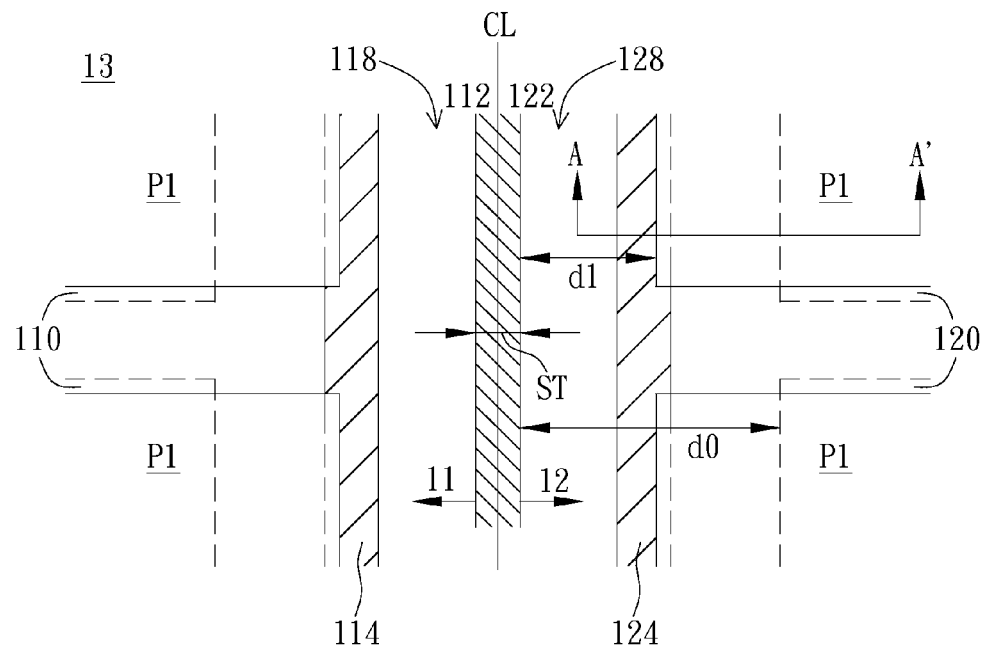
FIG. 5A illustrates a top view of at least a part of the metallurgy layer of the die overlapping the seal ring.

Then, please refer to FIG. 5A. FIG. 5A illustrates a top view of at least a part of the metallurgy layer of the dies 11 and 12 in a part 13 of the finished wafer 1 of FIG. 1 overlapping the seal ring. As shown in FIG. 5A, two sides of the cutting line CL on the part 13 of the finished wafer 1 are the cutting path ST. A die boundary 112 of the die 11 and a die boundary 122 of the die 12 are located at the left side and the right side of the cutting path ST.

In this embodiment, the die 12 has a contact portion 120, the die boundary 122, a seal ring 124, a saw reserved portion 128, and a metallurgy layer P1. The saw reserved portion 128 is located between the die boundary 122 and the seal ring 124. The seal ring 124 is located between the contact portion 120 and the saw reserved portion 128. The metallurgy layer P1 is disposed on the contact portion 120 and at least a part of the metallurgy layer P1 is extended to overlap the seal ring 124.

In practical applications, it is assumed that a distance between an outer edge of the contact portion 120 and the die boundary 122 is d0; a distance between an outer edge of the metallurgy layer P1 and the die boundary 122 (namely the outer edge of the saw reserved portion 128) is d1. In the prior arts, an outer edge of the conventional metallurgy layer is usually aligned with an outer edge of the contact portion; that is to say, the distance d0 between the outer edge of the conventional metallurgy layer and the die boundary is 55 μm. Different from the prior arts, the outer edge of the metallurgy layer P1 in this embodiment is extended to overlap the seal ring 124. Therefore, in this embodiment, the distance d1 is smaller than the distance d0. In an embodiment, d1 usually ranges from 0 to 54 μm; in another embodiment, it is preferred that d1 ranges from 10 to 54 μm, but not limited to this.

Similarly, the die 11 has a contact portion 110, the die boundary 112, a seal ring 114, a saw reserved portion 118, and a metallurgy layer P1. The saw reserved portion 118 is located between the die boundary 112 and the seal ring 114. The seal ring 114 is located between the contact portion 110 and the saw reserved portion 118. The metallurgy layer P1 is disposed on the contact portion 110 and at least a part of the metallurgy layer P1 is extended to overlap the seal ring 114. A distance between an outer edge of the contact portion 110 and the die boundary 112 is smaller than a distance (55 μm) between an outer edge of the metallurgy layer P1 and the die boundary 112 (namely the outer edge of the saw reserved portion 118). In an embodiment, the distance between the outer edge of the contact portion 110 and the die boundary 112 usually ranges from 0 to 54 μm; in another embodiment, it is preferred that the distance between the outer edge of the contact portion 110 and the die boundary 112 ranges from 10 to 54 μm, but not limited to this.

It should be noticed at least a part of the metallurgy layer on the die is extended to overlap the seal ring in the embodiment shown in FIG. 5A. In practical applications, at least a part of the metallurgy layer on the die can be also disposed on the saw reserved portion.

Figure 5B:
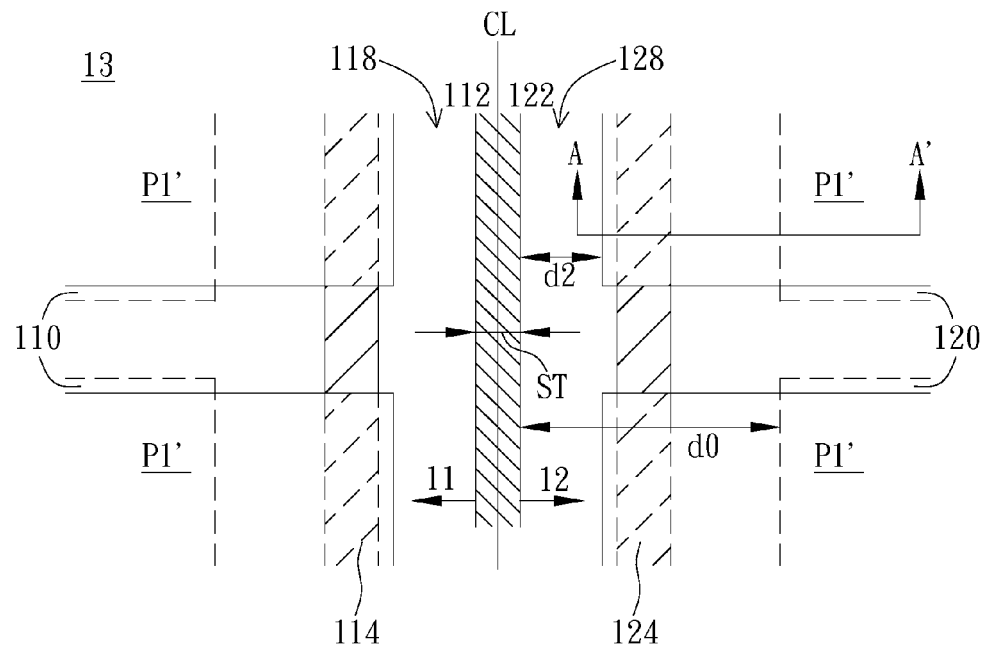
FIG. 5B illustrates a top view of at least a part of the metallurgy layer of the die overlapping the saw reserved portion.

As shown in FIG. 5B, in the die 12, it is assumed that a distance between an outer edge of the contact portion 120 and the die boundary 122 is d0; a distance between an outer edge of the metallurgy layer P1' and the die boundary 122 (namely the outer edge of the saw reserved portion 128) is d2. In the prior arts, an outer edge of the conventional metallurgy layer is usually aligned with an outer edge of the contact portion; that is to say, the distance d0 between the outer edge of the conventional metallurgy layer and the die boundary is 55 μm. Different from the prior arts, the outer edge of the metallurgy layer P1' in this embodiment is extended to overlap the saw reserved portion 128. Therefore, in this embodiment, the distance d2 is smaller than 55 μm. In an embodiment, d2 usually ranges from 0 to 54 μm; in another embodiment, it is preferred that d2 ranges from 2 to 54 μm, but not limited to this. As to the die 11 of FIG. 5B, since the die 11 is similar to the die 12, it is not repeated again.

After comparing FIG. 5A and FIG. 5B, it can be found that a part of the metallurgy layer P1 on the die 12 of FIG. 5A is extended to overlap the seal ring 124; a part of the metallurgy layer P1' on the die 12 of FIG. 5B is disposed on the saw reserved portion 128. And, the distance between the saw reserved portion 128 and the die boundary 122 is smaller than the distance between the seal ring 124 and the die boundary 122; that is to say, the distance d2 between the outer edge of the metallurgy layer P1' and the die boundary 122 in FIG. 5B is smaller than the distance d1 between the outer edge of the metallurgy layer P1 and the die boundary 122 in FIG. 5A.

Figure 6:
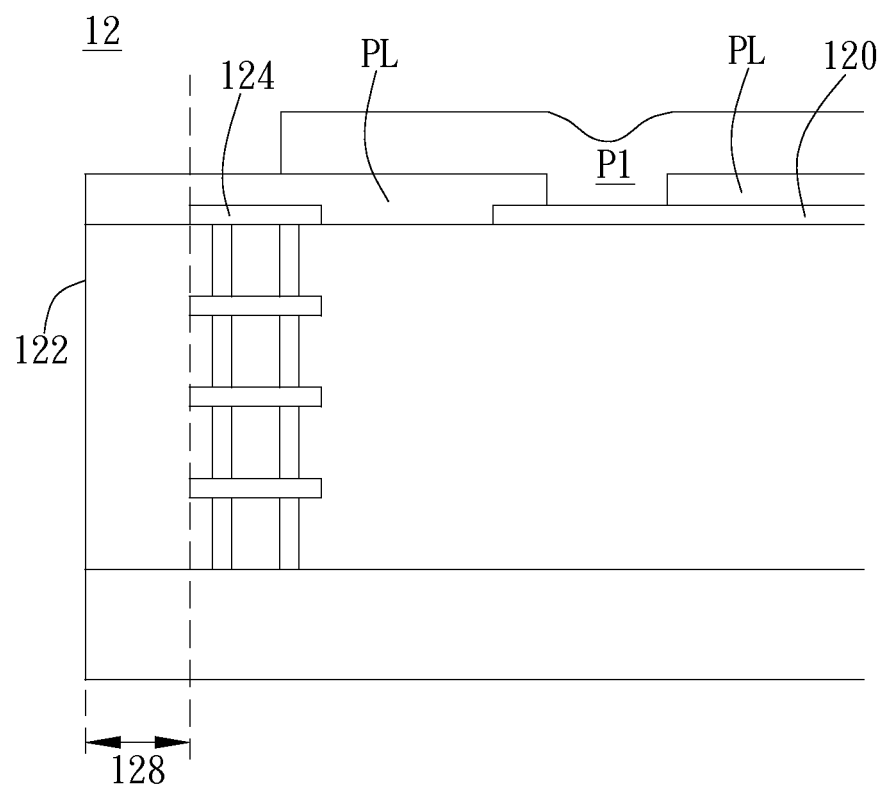
FIG. 6 illustrates a cross-section of the die cut from a part of the finished wafer along AA' in FIG. 5A.

Please refer to FIG. 6. FIG. 6 illustrates a cross-section of the die 12 cut from a part 13 of the finished wafer 1 along AA' in FIG. 5A. As shown in FIG. 6, the saw reserved portion 128 is located between the die boundary 122 and the seal ring 124; the seal ring 124 is located between the contact portion 120 and the saw reserved portion 128. A passivation layer PL is disposed on the contact portion 120 and the seal ring 124 and used to isolate the contact portion 120 and prevent the contact portion 120 from being electrically connected to outside. A hole is formed on the passivation layer PL to expose a part of the contact portion 120, so that the metallurgy layer P1 can be disposed on the contact portion 120 and the passivation layer PL and at least a part of the metallurgy layer P1 overlaps the seal ring 124.

Another embodiment of the invention is an IC packaging method. In this embodiment, the IC packaging method is used to form a packaging structure of a die having ICs in a portable apparatus, but not limited to this. In fact, the portable apparatus can be smart phone, notebook, wearable smart watch, or wearable smart glass, but not limited to this.

Figure 7:
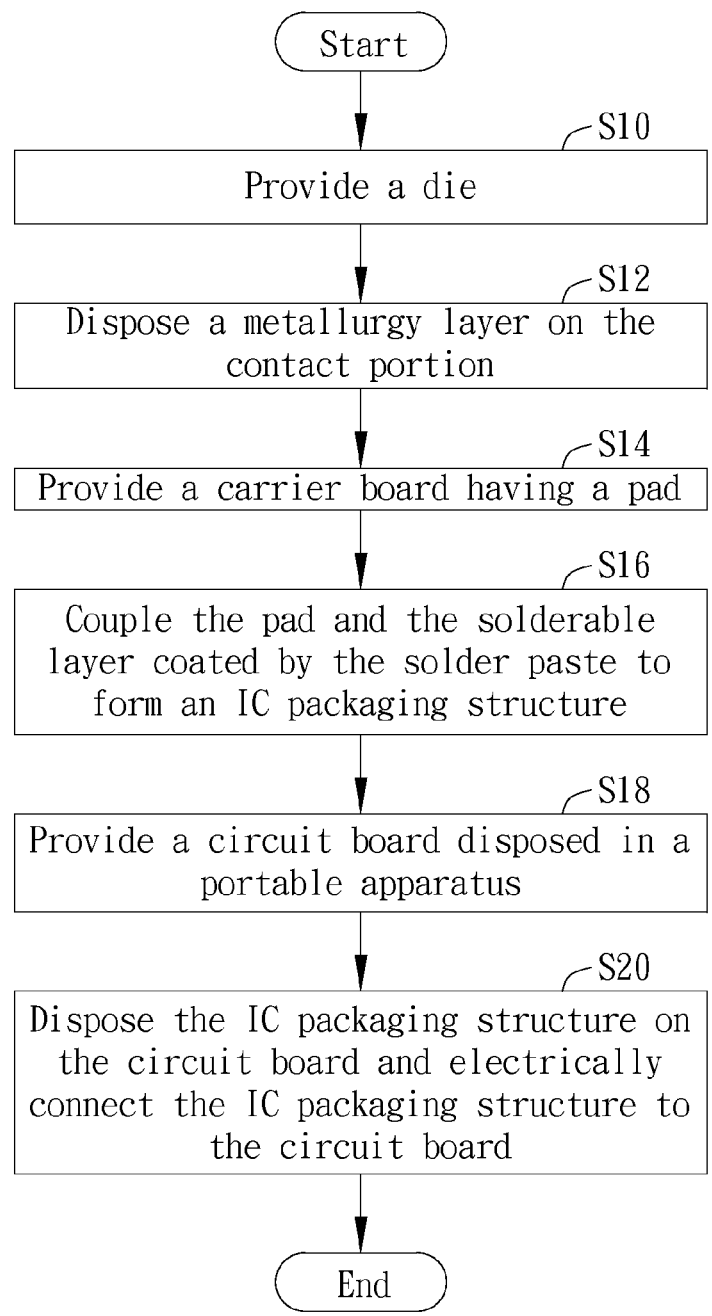
FIG. 7 illustrates a flowchart of the IC packaging method in another embodiment of the invention.

Please refer to FIG. 7. FIG. 7 illustrates a flowchart of the IC packaging method of this embodiment. As shown in FIG. 7, in the step S10, the method provides a die. In this embodiment, the die has a contact portion, a saw reserved portion, and a seal ring. The seal ring is disposed between the contact portion and the saw reserved portion.

In the step S12, the method disposes a metallurgy layer on the contact portion, wherein at least a part of the metallurgy layer overlaps the seal ring. In this embodiment, the metallurgy layer can include an adhesion layer connecting to the contact portion, a barrier layer, a solderable layer, and a solder paste coated on the solderable layer. In an embodiment, the thickness of the solderable layer is larger than the thickness of the solderable layer, but not limited to this case.

In the step S14, the method provides a carrier board having a solder pad. In the step S16, the method couples the solder pad and the solderable layer coated by the solder paste, so that the carrier board carries the packaging object to form an IC packaging structure. In this embodiment, a reflow method can be used to couple the solder pad and the solderable layer coated by the solder paste in the step S16, but not limited to this case.

In the step S18, the method provides a circuit board disposed in a portable apparatus. In the step S20, the method disposes the IC packaging structure formed in the step S16 on the circuit board and electrically connects the IC packaging structure to the circuit board, so that the portable apparatus can control the IC in an effective circuit area on the die to perform a specific function through the circuit board and the carrier board.

Compared to the prior arts, at least a part of the metallurgy layer of the IC die in the invention overlaps the seal ring and/or the saw reserved portion, so that the distance between the outer edge of the metallurgy layer and the outer edge of the saw reserved portion will be smaller than the minimum distance achieved by existing processes. Therefore, the ultra-small size IC packaging structure can be achieved and it can be widely applied in any portable apparatus having small size and volume (e.g., wearable electronic apparatus like smart watch or smart glass) with considerable market potential.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An integrated circuit (IC) packaging object, comprising:
   a die having a contact portion, a saw reserved portion, and a seal ring, wherein the seal ring is disposed between the contact portion and the saw reserved portion; and
   a metallurgy layer, disposed on the contact portion, wherein at least a part of the metallurgy layer overlaps the seal ring, and a distance between an outer edge of the metallurgy layer and an outer edge of the saw reserved portion is 0~54 μm.

2. The IC packaging object of claim 1, wherein the saw reserved portion has a default width and at least a part of the metallurgy layer is disposed on the saw reserved portion.

3. The IC packaging object of claim 2, wherein the default width is 10 μm.

4. The IC packaging object of claim 1, wherein the metallurgy layer comprises a solderable layer, and a solder paste is coated on the solderable layer to couple to a solder pad on a carrier board.

5. An integrated circuit (IC) packaging structure, comprising:
   an IC packaging object, comprising:
   a die having a contact portion, a saw reserved portion, and a seal ring, wherein the seal ring is disposed between the contact portion and the saw reserved portion; and
   a metallurgy layer, disposed on the contact portion, wherein at least a part of the metallurgy layer overlaps the seal ring, the metallurgy layer comprises a solderable layer coated by a solder paste, and a distance between an outer edge of the metallurgy layer and an outer edge of the saw reserved portion is 0~54 μm; and
   a carrier board, comprising a solder pad, wherein the solder pad is coupled to the solderable layer coated by the solder paste.

6. The IC packaging structure of claim 5, wherein the saw reserved portion has a default width and at least a part of the metallurgy layer is disposed on the saw reserved portion.

7. The IC packaging structure of claim 6, wherein the default width is 10 μm.

8. The IC packaging structure of claim 5, wherein an area of the solder pad is larger than an area of the solderable layer coated by the solder paste.

9. A portable apparatus, comprising:
   a circuit board; and
   an integrated circuit (IC) packaging object, comprising:
   a die having a contact portion, a saw reserved portion, and a seal ring, wherein the seal ring is disposed between the contact portion and the saw reserved portion; and a metallurgy layer, disposed on the contact portion, wherein at least a part of the metallurgy layer overlaps the seal ring, the metallurgy layer comprises a solderable layer coated by a solder paste, the IC packaging object is coupled to the circuit board through the solderable layer coated by the solder paste, and a distance between an outer edge of the metallurgy layer and an outer edge of the saw reserved portion is 0~54 μm.

10. The portable apparatus of claim 9, wherein the saw reserved portion has a default width and at least a part of the metallurgy layer is disposed on the saw reserved portion.

11. The portable apparatus of claim 10, wherein the default width is 10 μm.

12. An integrated circuit (IC) packaging method, comprising steps of:
   (a) providing a die, wherein the die has a contact portion, a saw reserved portion, and a seal ring, the seal ring is disposed between the contact portion and the saw reserved portion; and
   (b) disposing a metallurgy layer on the contact portion, wherein at least a part of the metallurgy layer overlaps the seal ring, and a distance between an outer edge of the metallurgy layer and an outer edge of the saw reserved portion is 0~54 μm.

13. The IC packaging method of claim 12, wherein the saw reserved portion has a default width and at least a part of the metallurgy layer is disposed on the saw reserved portion.

14. The IC packaging method of claim 13, wherein the default width is 10 μm.

* * * * *